(12) United States Patent
Uzoh

(10) Patent No.: US 10,796,936 B2
(45) Date of Patent: Oct. 6, 2020

(54) DIE TRAY WITH CHANNELS

(71) Applicant: Invensas Bonding Technologies, Inc., San Jose, CA (US)

(72) Inventor: Cyprian Emeka Uzoh, San Jose, CA (US)

(73) Assignee: Invensas Bonding Technologies, Inc., San Jose, CA (US)

( * ) Notice: Subject to any disclaimer, the term of this patent is extended or adjusted under 35 U.S.C. 154(b) by 0 days.

(21) Appl. No.: 15/806,822

(22) Filed: Nov. 8, 2017

(65) Prior Publication Data

US 2018/0182654 A1 Jun. 28, 2018

Related U.S. Application Data

(60) Provisional application No. 62/438,223, filed on Dec. 22, 2016.

(51) Int. Cl.
*H01L 21/00* (2006.01)
*H01L 21/673* (2006.01)
(Continued)

(52) U.S. Cl.
CPC .. *H01L 21/67336* (2013.01); *H01L 21/02076* (2013.01); *H01L 21/67333* (2013.01); *H01L 24/75* (2013.01); *H01L 24/83* (2013.01); *H01L 25/0657* (2013.01); *H01L 25/50* (2013.01); *H01L 2224/7501* (2013.01); *H01L 2224/7525* (2013.01); *H01L 2224/7565* (2013.01); *H01L 2224/7598* (2013.01);
(Continued)

(58) Field of Classification Search
CPC ......... H01L 21/67336; H01L 21/02076; H01L 21/67333; H01L 24/75; H01L 24/83; H01L 25/0657; H01L 25/50
See application file for complete search history.

(56) References Cited

U.S. PATENT DOCUMENTS 5,753,536 A 5/1998 Sugiyama et al.
5,771,555 A 6/1998 Eda et al.
(Continued)

FOREIGN PATENT DOCUMENTS

JP 07-176511 A 7/1995
JP 2007-067078 A 3/2007
(Continued)

OTHER PUBLICATIONS

International Search Report and Written Opinion, dated Mar. 28, 2018, for PCT Application No. PCT/US2017/065601, filed Dec. 11, 2017, 20 pages.
(Continued)

*Primary Examiner* — Mounir S Amer
*Assistant Examiner* — Alexander Belousov

(57) ABSTRACT

Representative implementations of devices and techniques provide a device and a technique for processing integrated circuit (IC) dies. The device comprises a die tray (such as a pick and place tray, for example) for holding the dies during processing. The die tray may include an array of pockets sized to hold individual dies. The technique can include loading dies on the die tray, cleaning the top and bottom surfaces of the dies, and ashing and activating both surfaces of the dies while on the die tray, eliminating the need to turn the dies over during processing.

10 Claims, 14 Drawing Sheets

(51) Int. Cl.
*H01L 21/02* (2006.01)
*H01L 23/00* (2006.01)
*H01L 25/065* (2006.01)
*H01L 25/00* (2006.01)

(52) U.S. Cl.
CPC .............. *H01L 2224/83012* (2013.01); *H01L 2224/83013* (2013.01); *H01L 2224/83896* (2013.01); *H01L 2224/83948* (2013.01)

(56) References Cited

U.S. PATENT DOCUMENTS

| | | | |
|---|---|---|---|
| 5,957,293 A * | 9/1999 | Pakeriasamy | H01L 21/67333 206/565 |
| 6,080,640 A | 6/2000 | Gardner et al. | |
| 6,465,892 B1 | 10/2002 | Suga | |
| 6,887,769 B2 | 5/2005 | Kellar et al. | |
| 6,908,027 B2 | 6/2005 | Tolchinsky et al. | |
| 7,045,453 B2 | 5/2006 | Canaperi et al. | |
| 7,105,980 B2 | 9/2006 | Abbott et al. | |
| 7,193,423 B1 | 3/2007 | Dalton et al. | |
| 7,222,737 B2 | 5/2007 | Caparro et al. | |
| 7,750,488 B2 | 7/2010 | Patti et al. | |
| 7,803,693 B2 | 9/2010 | Trezza | |
| 7,956,447 B2 | 6/2011 | Enquist et al. | |
| 8,183,127 B2 | 5/2012 | Patti et al. | |
| 8,349,635 B1 | 1/2013 | Gan et al. | |
| 8,377,798 B2 | 2/2013 | Peng et al. | |
| 8,441,131 B2 | 5/2013 | Ryan | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,524,533 B2 | 9/2013 | Tong et al. | |
| 8,620,164 B2 | 12/2013 | Heck et al. | |
| 8,647,987 B2 | 2/2014 | Yang et al. | |
| 8,697,493 B2 | 4/2014 | Sadaka | |
| 8,716,105 B2 | 5/2014 | Sadaka et al. | |
| 8,802,538 B1 | 8/2014 | Liu | |
| 8,809,123 B2 | 8/2014 | Liu | |
| 9,142,517 B2 | 9/2015 | Liu | |
| 9,171,756 B2 | 10/2015 | Enquist et al. | |
| 9,224,704 B2 | 12/2015 | Landru | |
| 9,230,941 B2 | 1/2016 | Chen et al. | |
| 9,257,399 B2 | 2/2016 | Kuang et al. | |
| 9,299,736 B2 | 3/2016 | Chen et al. | |
| 9,312,229 B2 | 4/2016 | Chen et al. | |
| 9,337,235 B2 | 5/2016 | Chen et al. | |
| 9,394,161 B2 | 7/2016 | Cheng et al. | |
| 9,437,572 B2 | 9/2016 | Chen et al. | |
| 9,443,796 B2 | 9/2016 | Chou et al. | |
| 9,461,007 B2 | 10/2016 | Chun et al. | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,620,481 B2 | 4/2017 | Edelstein et al. | |
| 9,656,852 B2 | 5/2017 | Cheng et al. | |
| 9,723,716 B2 | 8/2017 | Meinhold | |
| 9,728,521 B2 | 8/2017 | Tsai et al. | |
| 9,799,587 B2 | 10/2017 | Fujii et al. | |
| 9,893,004 B2 | 2/2018 | Yazdani | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,960,142 B2 | 5/2018 | Chen et al. | |
| 10,026,605 B2 | 7/2018 | Doub et al. | |
| 9,953,941 B2 | 8/2018 | Enquist | |
| 10,075,657 B2 | 9/2018 | Fahim et al. | |
| 10,269,756 B2 | 4/2019 | Uzoh | |
| 10,276,619 B2 | 4/2019 | Kao et al. | |
| 2004/0084414 A1 | 5/2004 | Sakai et al. | |
| 2005/0000866 A1 | 1/2005 | Caparro et al. | |
| 2005/0092637 A1* | 5/2005 | Baechle | B65D 5/006 206/386 |
| 2005/0194668 A1 | 9/2005 | Enquist et al. | |
| 2006/0057945 A1 | 3/2006 | Hsu et al. | |
| 2007/0111386 A1 | 5/2007 | Kim et al. | |
| 2009/0176333 A1* | 7/2009 | Matsubara | H01L 21/67333 438/113 |
| 2013/0078768 A1* | 3/2013 | Hsu | H01L 21/67333 438/113 |
| 2014/0092110 A1* | 4/2014 | Chan | B81B 3/0051 345/530 |
| 2014/0175655 A1 | 6/2014 | Chen et al. | |
| 2015/0064498 A1 | 3/2015 | Tong | |
| 2015/0279619 A1* | 10/2015 | Cho | H01L 21/67333 156/345.54 |
| 2016/0343682 A1 | 11/2016 | Kawasaki | |
| 2018/0175012 A1 | 6/2018 | Wu et al. | |
| 2018/0182639 A1 | 6/2018 | Uzoh et al. | |
| 2018/0182666 A1 | 6/2018 | Uzoh et al. | |
| 2018/0219038 A1 | 8/2018 | Gambino et al. | |
| 2018/0323177 A1 | 11/2018 | Yu et al. | |
| 2018/0323227 A1 | 11/2018 | Zhang et al. | |
| 2018/0331066 A1 | 11/2018 | Uzoh et al. | |
| 2019/0115277 A1 | 4/2019 | Yu et al. | |
| 2019/0131277 A1 | 5/2019 | Yang et al. | |

FOREIGN PATENT DOCUMENTS

| | | |
|---|---|---|
| JP | 2011-192663 A | 9/2011 |
| JP | 2013-33786 | 2/2013 |
| KR | 10-2006-0023661 A | 3/2006 |
| KR | 10-2011-0059227 A | 6/2011 |
| WO | 2005-043584 A2 | 5/2005 |

OTHER PUBLICATIONS

International Search Report and Written Opinion for PCT Application No. PCT/US2017/038808, dated Sep. 29, 2017, 18 pages.
Ker, Ming-Dou et al., "Fully Process-Compatible Layout Design on Bond Pad to Improve Wire Bond Reliability in CMOS ICs," IEEE Transactions on Components and Packaging Technologies, Jun. 2002, vol. 25, No. 2, pp. 309-316.
Moriceau, H. et al., "Overview of Recent Direct Wafer Bonding Advances and Applications", Advances in Natural Sciences—Nanoscience and Nanotechnology, 2010, 12 pages.
Nakanishi, H. et al., "Studies on SiO2—SiO2 Bonding with Hydrofluoric Acid. Room Temperature and Low Stress Bonding Technique for MEMS," Tech. Research Lab., 200, Elsevier Science S.A., 8 pages.
Oberhammer et al., "Sealing of Adhesive Bonded Devices on Wafer Level," in Sensors and Actuators A, vol. 110, No. 1-3, pp. 407-412, Feb. 29, 2004, see pp. 407-412; and figures 1(a)-1(I), 6 pages.
Plobi et al., "Wafer Direct Bonding: Tailoring Adhesion Between Brittle Materials," Materials Science and Engineering Review Journal, 1999, 88 pages.

* cited by examiner

DIE TRAY WITH CHANNELS

PRIORITY CLAIM AND CROSS-REFERENCE TO RELATED APPLICATION

This application claims the benefit under 35 U.S.C. § 119(e)(1) of U.S. Provisional Application No. 62/438,223, filed Dec. 22, 2016, which is hereby incorporated by reference in its entirety.

FIELD

The following description relates to processing of integrated circuits ("ICs"). More particularly, the following description relates to a tray for receiving and processing IC dies.

BACKGROUND

The demand for more compact physical arrangements of microelectronic elements such as integrated chips and dies has become even more intense with the rapid progress of portable electronic devices, the expansion of the Internet of Things, nano-scale integration, subwavelength optical integration, and more. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips and dies into a small space.

Microelectronic elements often comprise a thin slab of a semiconductor material, such as silicon or gallium arsenide. Chips and dies are commonly provided as individual, prepackaged units. In some unit designs, the die is mounted to a substrate or a chip carrier, which is in turn mounted on a circuit panel, such as a printed circuit board (PCB). Dies can be provided in packages that facilitate handling of the die during manufacture and during mounting of the die on the external substrate. For example, many dies are provided in packages suitable for surface mounting.

Numerous packages of this general type have been proposed for various applications. Most commonly, such packages include a dielectric element, commonly referred to as a "chip carrier" with terminals formed as plated or etched metallic structures on the dielectric. The terminals typically are connected to the contacts (e.g., bond pads) of the die by conductive features such as thin traces extending along the die carrier and by fine leads or wires extending between the contacts of the die and the terminals or traces.

In a surface mounting operation, the package may be placed onto a circuit board so that each terminal on the package is aligned with a corresponding contact pad on the circuit board. Solder or other bonding material is generally provided between the terminals and the contact pads. The package can be permanently bonded in place by heating the assembly so as to melt or "reflow" the solder or otherwise activate the bonding material.

Many packages include solder masses in the form of solder balls that are typically between about 0.1 mm and about 0.8 mm (5 and 30 mils) in diameter, and are attached to the terminals of the package. A package having an array of solder balls projecting from its bottom surface (e.g., surface opposite the front face of the die) is commonly referred to as a ball grid array or "BGA" package. Other packages, referred to as land grid array or "LGA" packages are secured to the substrate by thin layers or lands formed from solder. Packages of this type can be quite compact.

Certain packages, commonly referred to as "chip scale packages," occupy an area of the circuit board equal to, or only slightly larger than, the area of the device incorporated in the package. This scale is advantageous in that it reduces the overall size of the assembly and permits the use of short interconnections between various devices on the substrate, which in turn limits signal propagation time between devices and thus facilitates operation of the assembly at high speeds.

Semiconductor dies can also be provided in "stacked" arrangements, wherein one die is provided on a carrier, for example, and another die is mounted on top of the first die. These arrangements can allow a number of different dies to be mounted within a single footprint on a circuit board and can further facilitate high-speed operation by providing a short interconnection between the dies. Often, this interconnect distance can be only slightly larger than the thickness of the die itself.

For interconnection to be achieved within a stack of die packages, interconnection structures for mechanical and electrical connection may be provided on both sides (e.g., faces) of each die package (except for the topmost package). This has been done, for example, by providing contact pads or lands on both sides of the substrate to which the die is mounted, the pads being connected through the substrate by conductive vias or the like. Examples of stacked chip arrangements and interconnect structures are provided in U.S. Patent App. Pub. No. 2010/0232129, the disclosure of which is incorporated by reference herein.

However, some stacked die arrangements, such as those that employ direct or hybrid bonding, such as the stacked dies shown in U.S. Patent App. Pub. No. 20170200711, are sensitive to the presence of particles or contamination on one or both surfaces of the stacked dies. For instance, particles remaining from processing steps or contamination from die processing or tools can result in poorly bonded regions between the stacked dies, or the like. Extra handling steps during die processing can further exacerbate the problem, leaving behind residue. Some die processing techniques include multiple steps (adding to assembly costs) to remove particles or contamination. Nevertheless, the added steps used do not always remove all of the particles or contamination on one or both sides of the dies.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

FIG. 3A shows a top view of such a die, FIG. 3B shows a profile view of such a die, and FIG. 3C shows a profile view of a stack of such dies.

FIGS. 5A-5C show illustrations of example pockets, showing a comparison of example die retainers and spacers of a die tray, such as the die tray of FIG. 4, according to various implementations.

FIG. 7A shows a plan view, FIG. 7B shows a profile view according to a first embodiment, and FIG. 7C shows a profile view according to a second embodiment.

FIG. 8A shows a plan view and FIG. 8B shows a profile view.

FIG. 9A shows a plan view and FIG. 9B shows a profile view.

DETAILED DESCRIPTION

Overview

Figure 1:
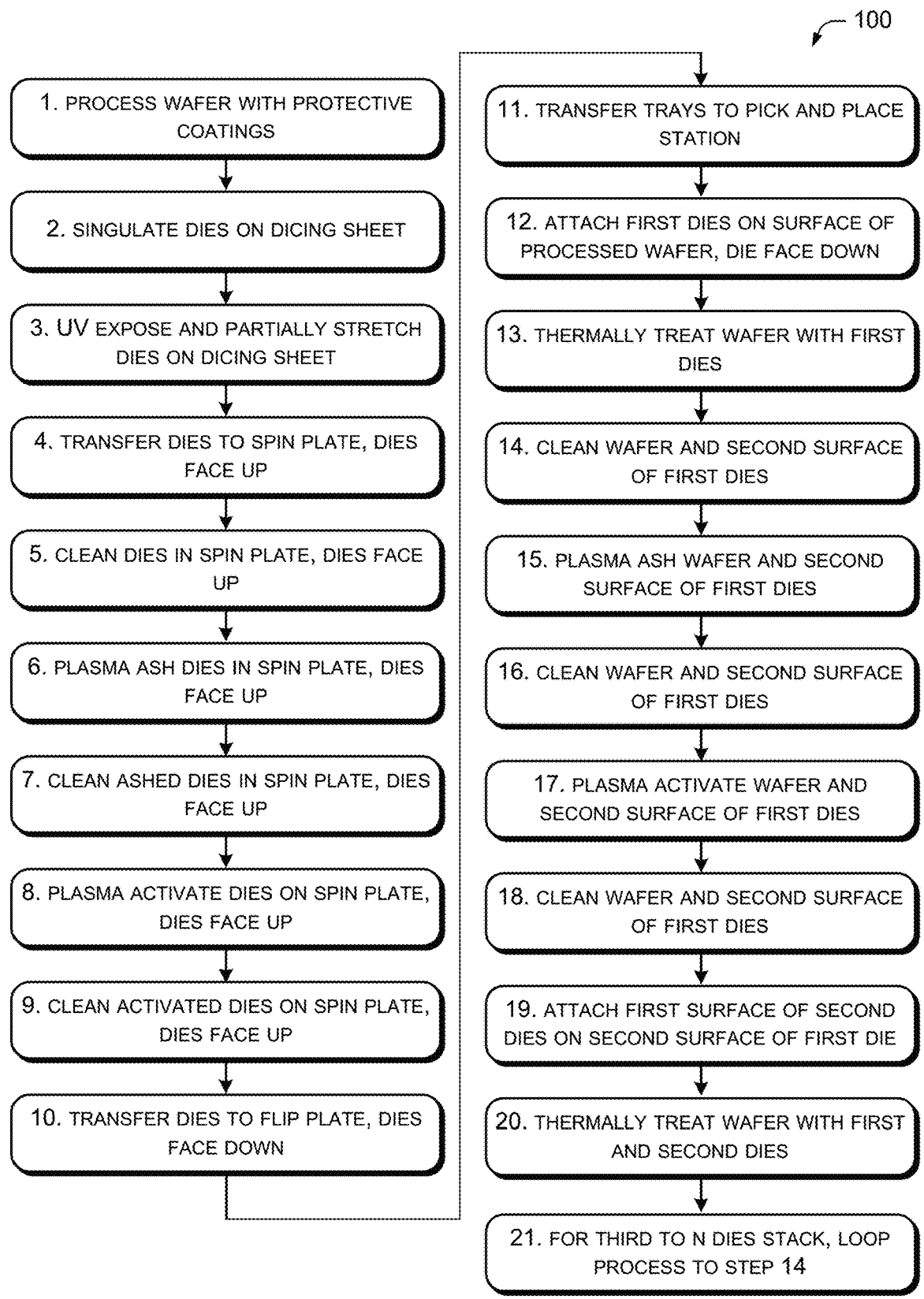
FIG. 1 is a flow diagram illustrating an example die processing sequence using a spin plate.

Various embodiments of a device and a technique for processing integrated circuit (IC) dies are disclosed. The device comprises a die tray (such as a pick and place tray, for example) for holding the dies during processing. The die tray may include an array of pockets sized to hold individual dies.

The processing technique can include loading dies on the die tray, cleaning the top and bottom surfaces of the dies, and ashing and activating both surfaces of the dies while on the die tray (eliminating the need to turn the dies over during processing). The processing can prepare the dies to be bonded in stacked arrangements. After processing, the die tray may then be used for pick and place operations, including providing the dies for stacking and bonding.

In various embodiments, using the tray and the processing techniques can reduce die fabricating and processing costs and can reduce the complexity of fabricating electronic packages that include the dies. Dies to be stacked and bonded using direct bonding (e.g. ZIBOND® available from Invensas Bonding Technologies, Inc.) or hybrid bonding (e.g. DBI® available from Invensas Bonding Techniques, Inc.) techniques, which can be susceptible to particles and contaminants, can particularly benefit. Whether bonding two surfaces using a low temperature covalent bond between two corresponding semiconductor and/or insulator layers, the process known by Zibond®, or whether also forming interconnections along with the bonding technique, the process commonly known as DBI®, high levels of flatness and cleanliness are desirable across the bonding surface. Thus, removing particles between the bonding surfaces may dramatically improve yield and reliability.

In an implementation, large batches of dies can be processed at a time, using multiple die trays. For example, multiple trays of dies may be loaded into a batch processing chamber, or the like, increasing manufacturing throughput.

In some embodiments, several process steps can be eliminated, lowering manufacturing complexity and costs, while improving the overall cleanliness of the dies (e.g., reducing the occurrence of particles, contaminants, residue, etc.). Reduced handling of the dies can also minimize particle generation.

Various implementations and arrangements are discussed with reference to electrical and electronics components and varied carriers. While specific components (i.e., wafers, integrated circuit (IC) chip dies, etc.) are mentioned, this is not intended to be limiting, and is for ease of discussion and illustrative convenience. The techniques and devices discussed with reference to a wafer, die, or the like, are applicable to any type or number of electrical components, circuits (e.g., integrated circuits (IC), mixed circuits, ASICS, memory devices, processors, etc.), groups of components, packaged components, structures (e.g., wafers, panels, boards, PCBs, etc.), and the like. Each of these different components, circuits, groups, packages, structures, and the like, can be generically referred to as a "microelectronic element." For simplicity, such components will also be referred to herein as a "die."

Implementations are explained in more detail below using a plurality of examples. Although various implementations and examples are discussed here and below, further implementations and examples may be possible by combining the features and elements of individual implementations and examples.

Referring to FIG. 1, a flow diagram illustrating an example die processing sequence using a spin plate is shown. At blocks 1-4 the process begins with preparing a wafer by applying protective coatings, singulating the wafer into dies (i.e., a first set of dies) on a dicing sheet, exposing the dies and dicing sheet to UV radiation and stretching the dicing sheet, and transferring the dies to a spin plate, with the dies face up. At blocks 5-9 the process includes the steps of plasma ashing the top surface of the dies, cleaning the dies, plasma activating the top surface of the dies, and re-cleaning the top surface of the dies.

At block 10, the dies are transferred from the spin plate to a flip plate, to position the dies face down (the bottom surfaces of the dies are up). At block 11, the dies are transferred to a pick and place station, where (at block 12) the dies are attached to a wafer surface, with the dies face down. At block 13, the dies on the wafer are thermally treated.

At blocks 14-18 the wafer and the exposed surface of the dies is cleaned, plasma ashed, re-cleaned, plasma activated, and cleaned again. At block 19 a second set of dies (with the top surface previously prepared as described at blocks 1-11) is attached to the first set of dies, forming a stacked die arrangement. In an example, the top (prepared) surface of the second dies is attached to the exposed (bottom) surface of the first dies. At block 20, the wafer with the first and second dies is thermally treated. For additional dies to be added to the stacked die arrangement (e.g., third or more dies), at block 21, the process is looped back to block 14, and continues until the desired quantity of dies has been added to each stack.

In various examples, the manufacturing process as described with reference to FIG. 1 can use approximately 13+7(n−1); n>0 steps to complete (where n=the desired quantity of dies in the stack).

Figure 2A:
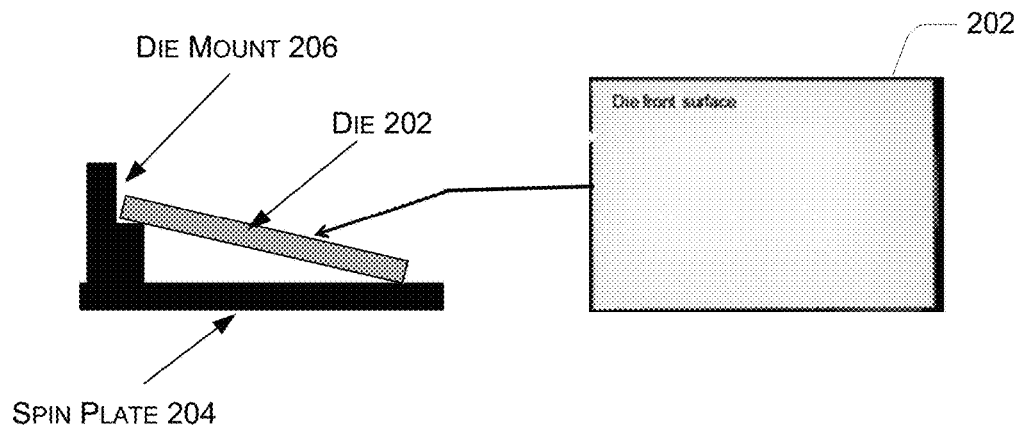
FIGS. 2A and 2B show an example die after cleaning a front surface (FIG. 2A) and a back surface (FIG. 2B) of the die.
Figure 2B:
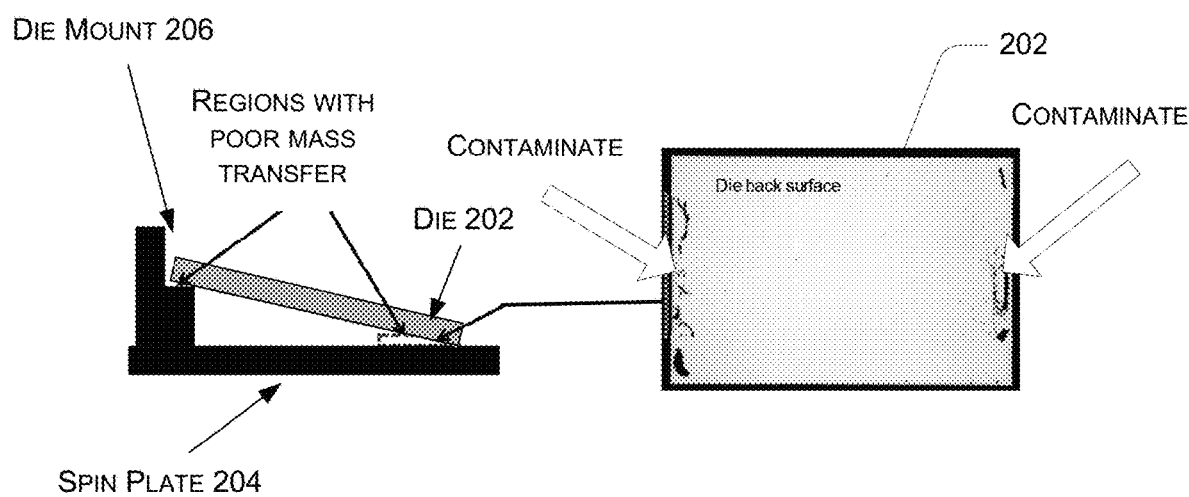

In some cases, in spite of the numerous cleaning steps included in the process, the dies are left with some contamination or particles on one or more surfaces of the dies. FIGS. 2A and 2B show dies 202 loaded into an example spin plate 204 for cleaning, with the front surface up. As shown in FIGS. 2A and 2B, the top or front surface of the die 202 may be cleaned free of contamination (FIG. 2A) while the bottom or back surface of the die 202 may be left with particles or contamination, for example residues of the protective layer used in the singulation step. (FIG. 2B). In some examples, the contamination can be the result of poor mass transfer, including stagnant processing materials that are trapped at various locations during the processing steps. As shown in FIG. 2B, often these locations can be associated with contact regions between the die 202 and the spin plate 204 or between the die 202 and a die mount 206 on the spin plate 204.

Figure 3A:
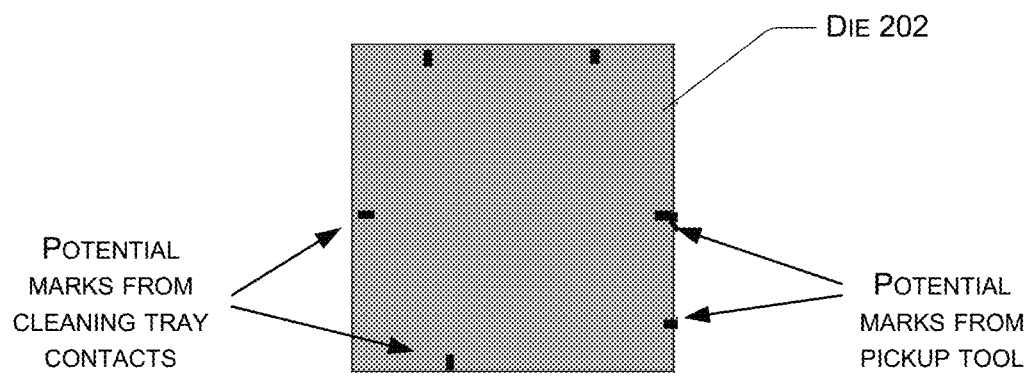
FIGS. 3A-3C show examples of dies with peripheral particles or defects.
Figure 3B:
Figure 3C:
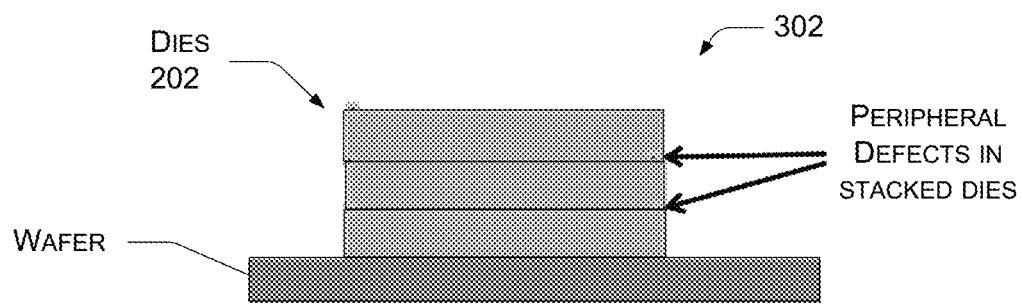

Additionally, as shown in FIGS. 3A-3C, extensive handling of the dies 202 during the multiple processing steps can add particles or contaminants to the dies 202, including after the dies 202 have been cleaned. The location of the particles or defects can determine whether the particles or defects can be potentially problematic for a stacked arrangement 302. For instance, some particles and defects can cause poor bonding between dies 202, and the like, as shown in FIG. 3C. Poor bonding can lead to stacked arrangements 302 that fail initially (reducing manufacturing yield), or have early infant failure (resulting in high unreliability of the manufactured components).

Example Implementations

Figure 4:
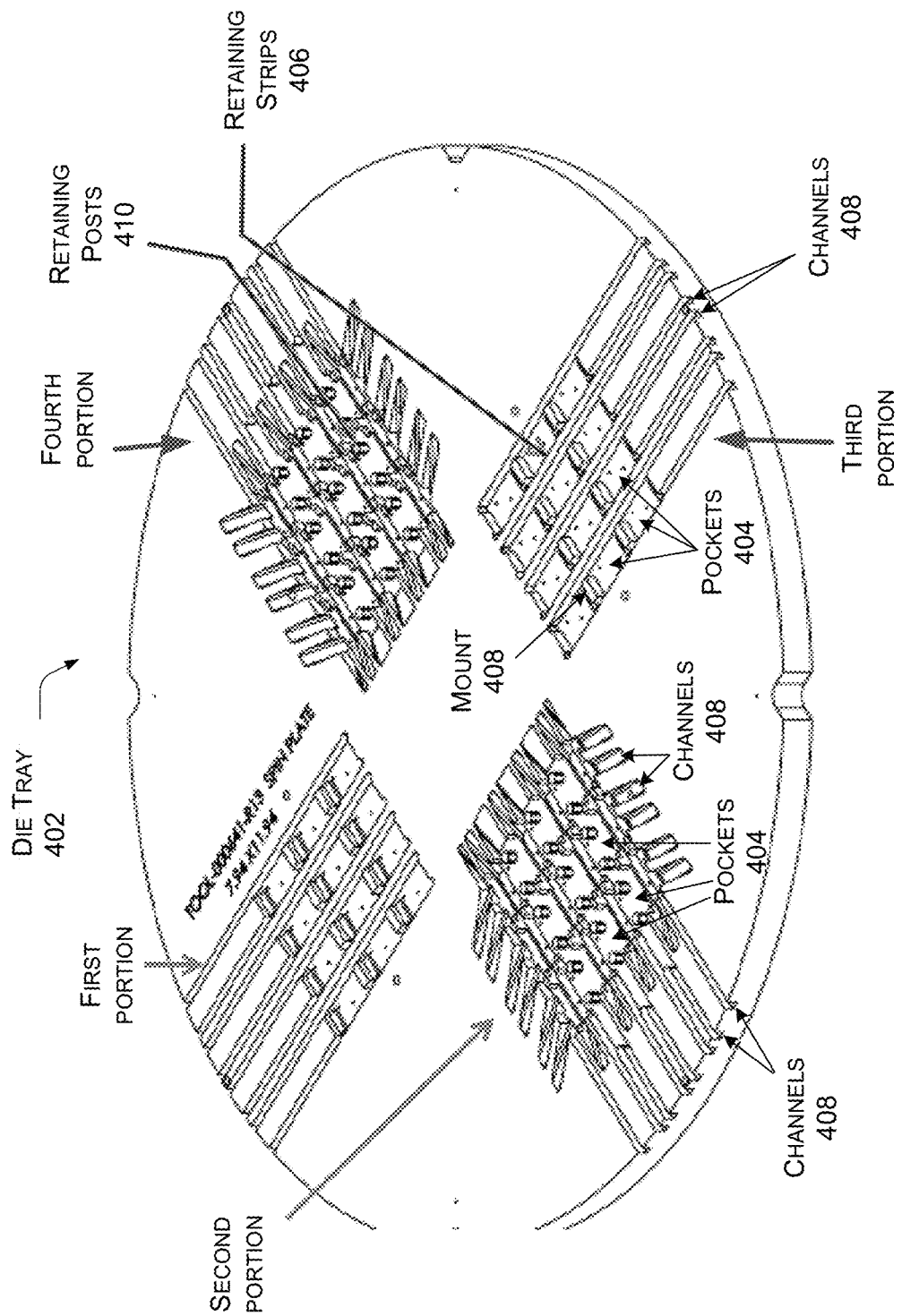
FIG. 4 is an illustration of an example die tray, according to an implementation.
Figure 5C:
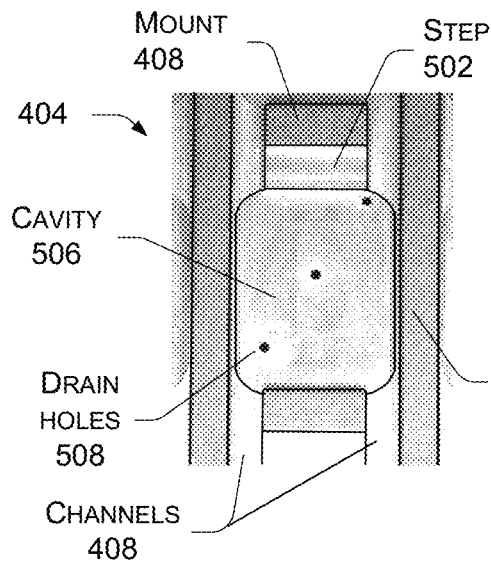
Figure 5C:
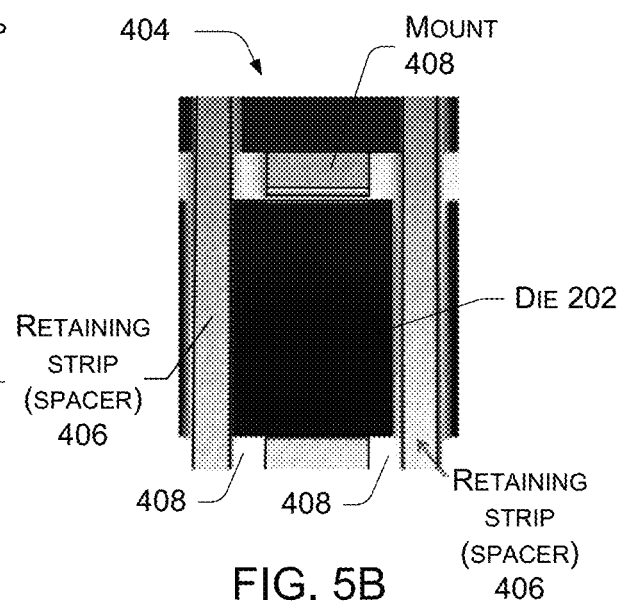
Figure 5C:
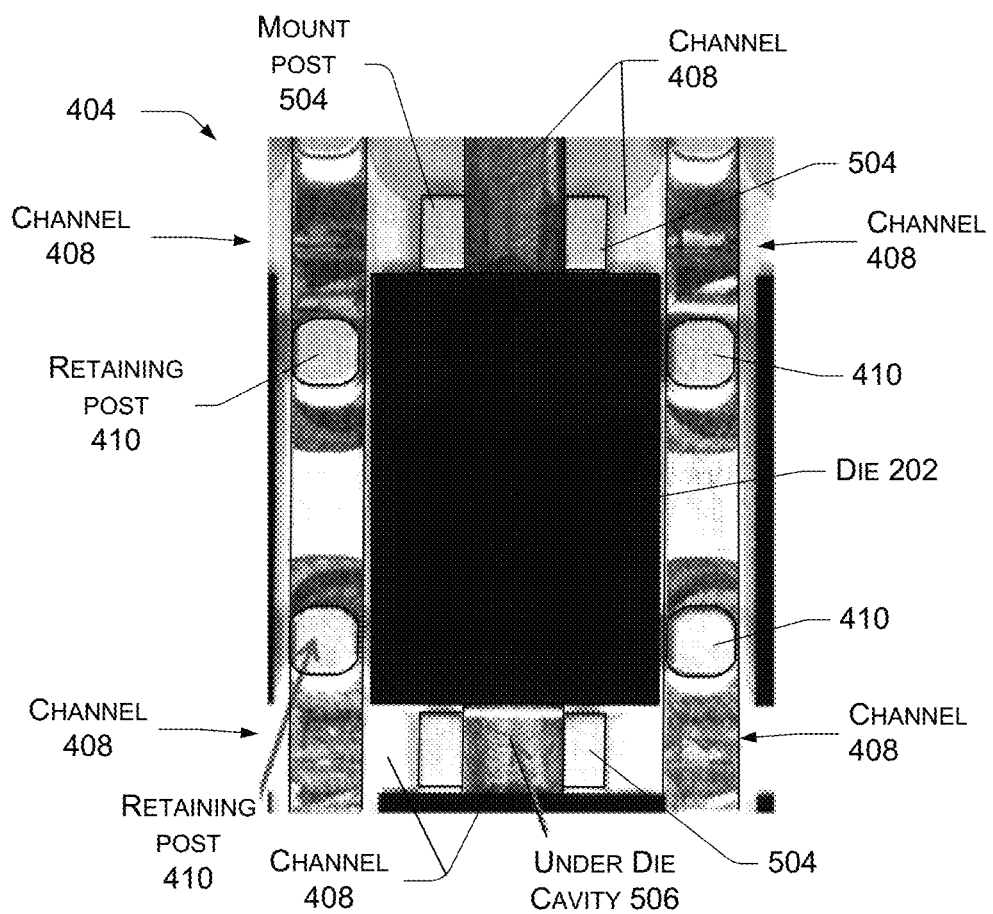

FIG. 4 is an illustration of a die tray 402, according to an example implementation.ABies 202 are loaded into pockets 404 (pockets are also shown in FIG. 5) of the die tray 402 and are processed while within the pockets 404 of the die tray 402. For example, the die tray 402 may rotate during some processing steps. In some implementations, the pockets 404 are arranged in an array, or another convenient pattern. This allows multiple dies 202 to be processed at the same time. Pockets 404 may be configured to hold the dies 202 at an angle (as shown in FIG. 2) to facilitate fluid material runoff during cleaning and other processes.

The example die tray 402 illustrated in FIG. 4 includes four portions (first, second, third, and fourth). This is for illustration and discussion purposes. In various implementations, a die tray 402 may include a different arrangement of pockets 404 or portions. For instance, a die tray 402 may include a single pocket 404 design, or multiple pocket 404 designs as shown in FIG. 4.

Referring to FIGS. 4, 5A, and 5B, the first and third portions of the die tray 402 (see FIG. 4) illustrate a pocket 404 design (which is also shown at FIG. 5A and FIG. 5B) having retaining strips 406 arranged to hold dies 202 laterally, and mounts 408 to hold dies 202 longitudinally. The mounts 408 may include one or more steps 502, and are arranged to support one or more edges of the die 202 in the pocket 404. The mounts 408 can help position the dies 202 at an angle within the pockets 404, as shown in FIG. 2, by holding one of the edges of the die 202 higher than an opposite edge of the die 202.

The second and fourth portions of the die tray 402 (see FIG. 4) illustrate a pocket 404 design (also shown at FIG. 5C) having retaining posts 410 arranged to hold the dies 202 laterally and mount posts 504 arranged to hold the dies 202 longitudinally. The mount posts 504 may also include one or more steps (not shown), and are arranged to support one or more edges of the die 202 in the pocket 404. In various embodiments, the retaining posts 410 and the mount posts 504 may have various shapes, designs and configurations. In the embodiments, the retaining posts 410 and/or the mount posts 504 may be designed to have minimal contact with the die 202. For example, the retaining posts 410 and/or the mount posts 504 may include a die-contact surface with minimal area. In another example, the retaining posts 410 and/or the mount posts 504 may include an elliptical or spherical shaped die-contact surface to minimize contact with the die 202. In one example, the die-contact is less than 10-20% of the edge length or width of the die 202.

In some embodiments, one or more of the retaining posts 410 and/or the mount posts 504 may comprise a spring device such as a compression spring, a conical spring, or the like. For example, one or more of the retaining posts 410 and/or the mount posts 504 may be comprised of a spring material and/or have a spring-like construction. The spring-like construction includes gaps in the structure of the retaining posts 410 and/or the mount posts 504, which allows fluids, such as cleaning fluids, for example, to pass through and to circulate freely around the die 202 during the cleaning process. In some embodiments, one or more clips or the like (e.g., some form of torsion springs, etc.) may contact a portion of the surface of the die 202 to prevent the dies from sliding around on the die tray 402. It is preferable the surface of the spring devices be chemical and plasma resistant. For example, metallic springs may be used as retaining posts 410 and mounting posts 504. To enhance the chemical and plasma resistance of the retaining posts 410 and the mounting posts 504, the retaining posts 410 and the mounting posts 504 may be coated with a chemical and plasma resistant layer, for example, an aluminum oxide or yttrium oxide layer or yttrium fluoride or combinations of the above amongst others.

Similarly, the die tray 402 may be fabricated from metallic or polymeric material. In one embodiment, the die tray 402 may be coated with one or more chemical and plasma resistant layers, for example, an aluminum oxide or yttrium oxide layer or yttrium fluoride or combinations of both amongst others. In other embodiments, the die tray 402 may be fabricated from a ceramic or glass-ceramic material, for example aluminum oxide. It is practical that the die tray 402 does not release or emit particulates that will contaminate the bonding surface of the cleaned dies 202.

As shown in FIGS. 4, 5A, 5B, and 5C, the pockets 404 and the die tray 402 may include one or more channels 408 arranged to carry fluids to and away from the dies 202 during processing. For example, the pockets 404 may include a cavity 506 or space below the die 202 for cleaning materials or other processing materials or waste materials to collect, and the cavity 506 may be coupled to one or more channels 408 arranged to direct the materials away from the dies 202.

In some implementations, the channels 408 are arranged to extend longitudinally from the pockets 202, as shown in FIG. 4 at the "first" and "third" portions of the die tray 402, and in the example pockets illustrated at FIGS. 5A and 5B. In other implementations, additional channels 408 are also arranged to extend laterally from the pockets 404, as shown in FIG. 4 at the "second" and "fourth" portions, and in FIG. 5C. In the implementations, the material collecting in the under-die cavity 506 is directed away from the die pockets 404 by the arrangement of channels 408. In another embodiment, as shown in FIG. 5A, drain holes 508 may also be included in the under die cavity 506 to further direct material from the die pocket 404.

In embodiments where the retaining posts 410 and/or the mounting posts 504 are comprised of spring devices (or have gaps, such as with a spring-like construction) one or more of the under die cavity 506 or the channels 408 may not be needed or may not be present on the die tray 402. In such an embodiment, the die 202 is restrained peripherally by arrangement of spring devices and the cleaning fluid or fluids flows with minimal restraints around and under the die 202 through the various gaps in the coils of the spring devices and the gaps between the spring devices.

Figure 6A:
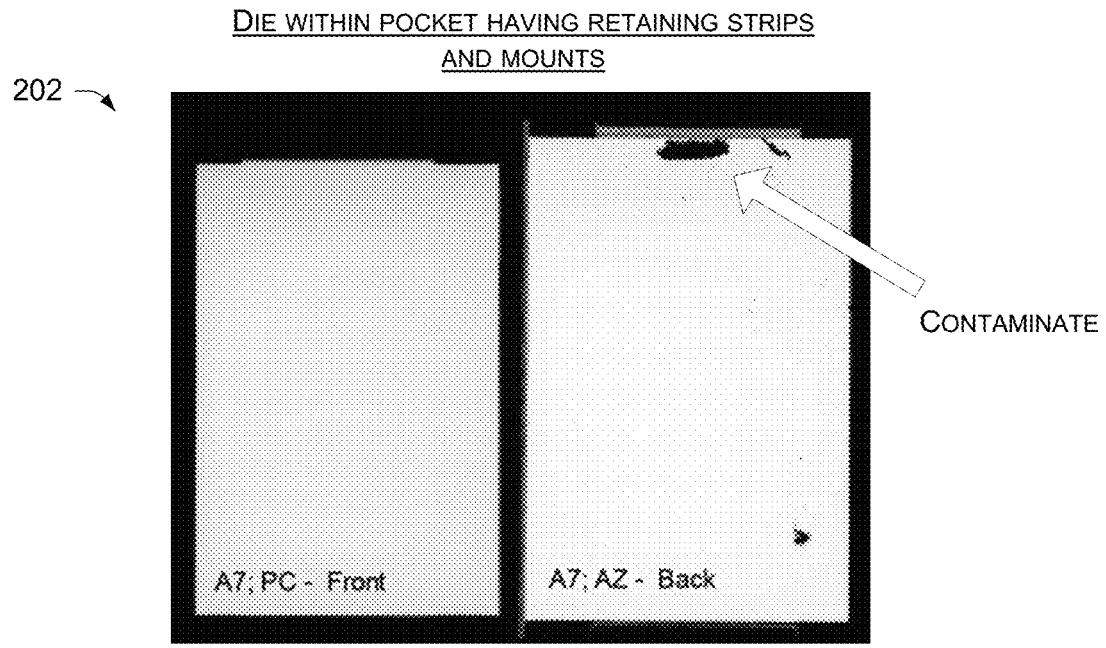
FIGS. 6A and 6B each show an example die after cleaning a front surface and a back surface of the dies.

FIG. 6A shows front and back surfaces of a die 202 after cleaning in a die tray 402 using die pockets 404 having retaining strips 406 and mounts 408, and longitudinal channels 408, as shown in FIG. 4 at the "first" and "third" portions, and in FIGS. 5A and 5B. The front surface of the die 202 appears clean and the back surface shows an improvement in cleanliness over the back surface of the die 202 from FIG. 2B. However, some contaminates are still showing on the back surface of the die 202 of FIG. 6A.

Figure 6B:
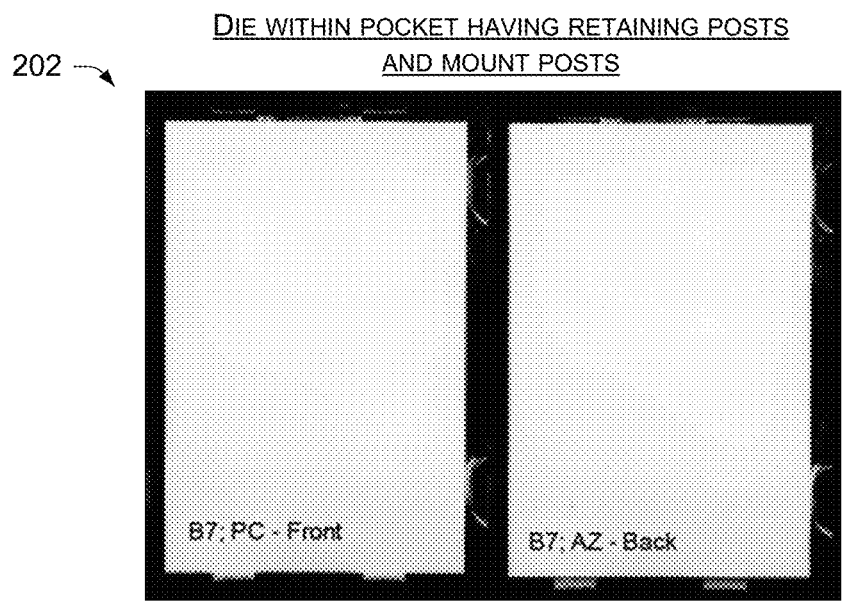

FIG. 6B shows front and back surfaces of a die 202 after cleaning in a die tray 404 using die pockets 404 having retaining posts 410 and mount posts 504, and longitudinal and lateral channels 408, as shown in FIG. 4 at the "second" and "fourth" portions, and in FIG. 5C. The front and back surfaces of the die 202 appear clean, a significant improvement over the back surface of the die 202 from FIG. 2B, as well as an improvement over the back surface of the die 202 from FIG. 6A. In various implementations, minimal contact of the retaining posts 410 and mount posts 504 to the die 202 and the use of lateral as well as longitudinal channels 408 from the pockets 404 results in the least amount of particles and contaminates remaining on the front and back surfaces of a die 202 (if any) after cleaning. This is due to minimizing stagnant fluid collecting under the die 202, by efficiently channeling the fluid away from the pocket 404 as well as minimizing contact with the die 202 surfaces.

Figure 7A:
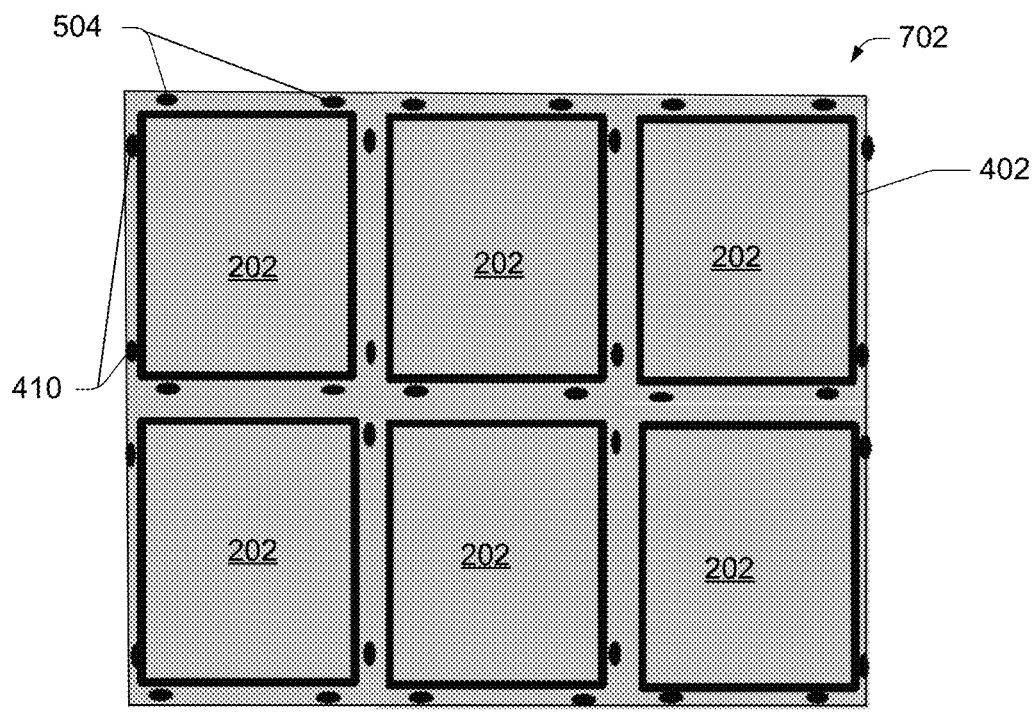
FIGS. 7A-7C illustrate an example die tray, according to an embodiment.
Figure 7B:
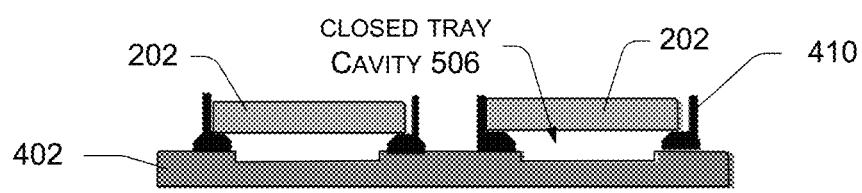
Figure 7C:
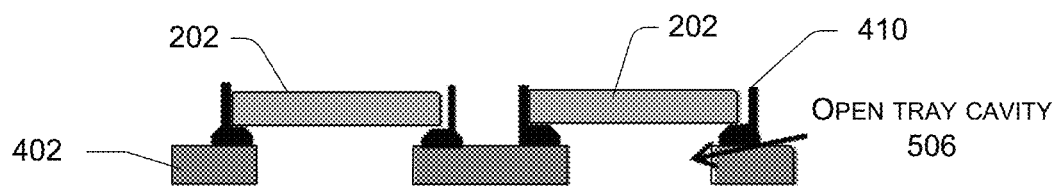

FIGS. 7A-7C illustrate another example die tray 402 arrangement for front and backside wet and dry cleaning of multiple dies 202. FIG. 7A shows a partial view of a die tray array 702 (an array portion of a die tray 402, carrying multiple dies 202). As shown in FIG. 7A, the retaining posts 410 and mount posts 504 (lateral and longitudinal die support posts) have a minimal surface area in contact with the dies 202, due to their minimal dimensions and elliptical contact surfaces. The minimal contact with the dies 202 can help prevent contaminants from being transferred to the die 202 surfaces.

FIG. 7B shows a cross-sectional view of the example die tray 402 according to a first embodiment having a "closed tray cavity 506," and FIG. 7C shows a cross-sectional view of the example die tray 402 according to a second embodiment having an "open tray cavity 506." The tray cavities 506 give a place for cleaning materials and other waste materials to collect and be directed away from the dies 202. For example, lateral and/or longitudinal channels 408 coupled to the tray cavities 506 can direct the fluids away from the dies 202. The open tray cavity 506 design can potentially have more waste fluid draining capability in some cases.

In an implementation, the die tray 402 may be comprised of a mesh material. For example, the mesh material may allow the die tray 402 to have additional fluid draining capability.

Figure 8A:
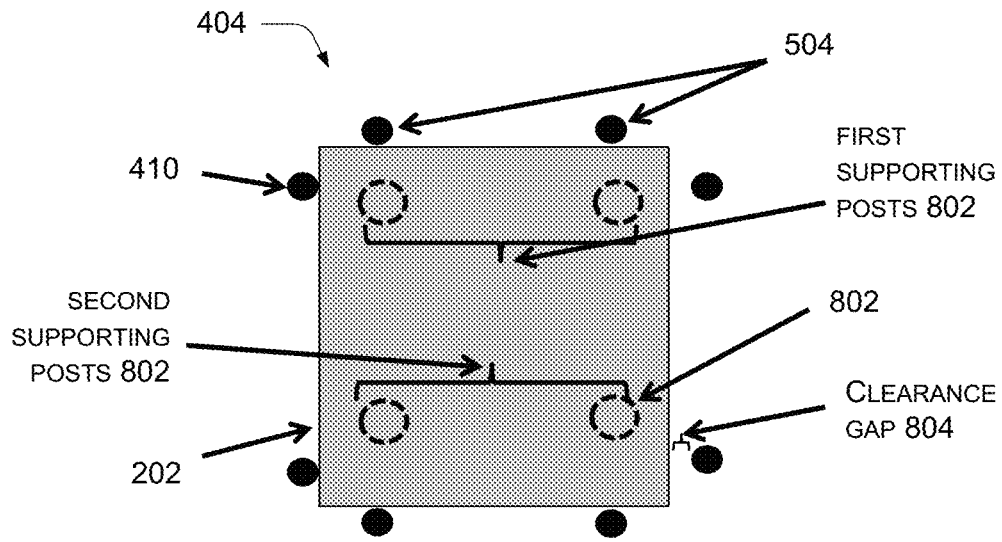
FIGS. 8A and 8B illustrate an example die tray, according to a third embodiment.
Figure 8B:
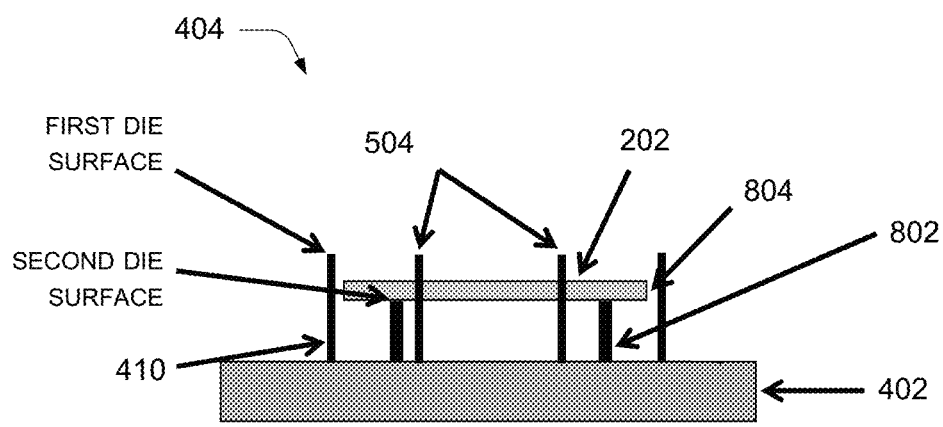

FIGS. 8A and 8B illustrate another example die tray 402 arrangement for front and backside (first and second die 202 surfaces) wet and dry cleaning of a die 202. FIG. 8A shows a plan view (top view) of an example pocket 404 of a die tray 402 and FIG. 8B shows a profile view, according to an embodiment. As shown in FIGS. 8A and 8B, the die 202 is supported off of a surface of the tray 402 by multiple element supporting posts 802 (four are shown, however, other quantities of supporting posts 802 may be used). In some implementations, the element supporting posts 802 may have different heights, (e.g., the first supporting posts 802 may be taller than the second supporting posts 802, for instance) so that the die 202 is held at an angle.

The die 202 is also held in place by retaining posts 410 and mount posts 504, which have a minimal surface area in contact with the dies 202, due to their minimal dimensions and elliptical contact surfaces. The minimal contact with the dies 202 can help prevent contaminants from being transferred to the surfaces of the die 202. As shown in FIGS. 8A and 8B, the retaining posts 410 and mount posts 504 may be positioned on the tray so that there is a preselected clearance gap 804 between the die 202 and the retaining posts 410 and mount posts 504. This positioning can also help to minimize contaminant transfer from the posts (410, 504) to the die 202, by reducing contact with the die 202 edges.

Figure 9A:
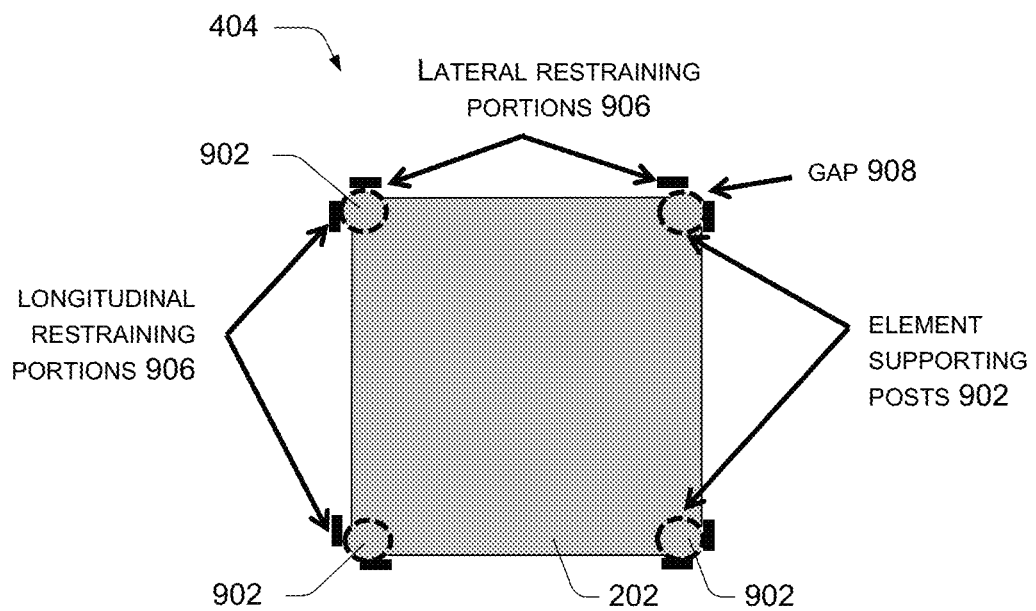
FIGS. 9A and 9B illustrate an example die tray, according to a fourth embodiment.
Figure 9B:
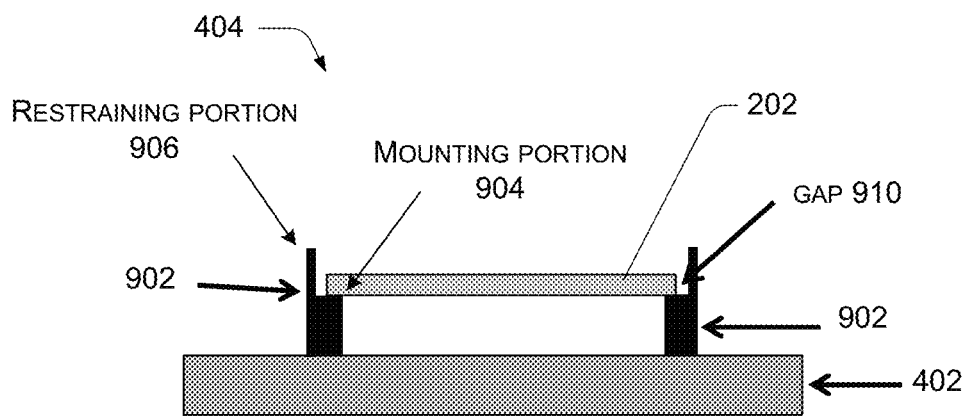

FIGS. 9A and 9B illustrate a further example die tray 402 and pocket 404 arrangement for front and backside wet and dry cleaning of a die 202. FIG. 9A shows a plan view (top view) of an example pocket 404 of a die tray 402 and FIG. 9B shows a profile view of the same, according to an embodiment. As shown in FIGS. 9A and 9B, the die 202 is supported off the surface of the tray 402 by multiple element supporting posts 902 (four are shown, however, other quantities of supporting posts 902 may be used). In some implementations, the element supporting posts 902 may have different heights, (e.g., the supporting posts 902 at one end may be taller than the supporting posts 902 at an opposite end, for instance) so that the die 202 is held at an angle. In one embodiment, the shorter supporting posts 902 may comprise the surface of the tray 402.

In an implementation as shown, the supporting posts 902 can include a mounting portion 904 and a restraining portion 906. The mounting portion 904 includes a shelf or rest for the die 202, which supports the die 202 off the surface of the tray 402. The restraining portion 906 includes a back-stop, guide or the like, protruding above the mounting portion to hold the die 202 in place in the pocket 404. In various embodiments, the pocket 404 includes lateral and longitudinal restraining portions 906, to hold the die 202 in the pocket 404 during processing, much like the retaining posts 410 and mount posts 504.

The mounting portions 904 and the restraining portions 906 can have a minimal surface area in contact with the dies 202, based on their construction with minimal dimensions and contact surfaces. The restraining portions 906 may be formed and placed so that there is an opening or gap 908 between the lateral and longitudinal restraining portions 906, further minimizing contact with the die 202. In an embodiment, the opening or gap 908 at the restraining portions 906 can provide a channel for fluids to be directed away from or off of the die 202, so that the fluid does not collect on the surface of the die 202.

As shown in FIG. 9B, the restraining portions 906 may also be positioned so that there is a preselected clearance gap 910 between the die 202 and the restraining portions 906. This positioning can also help to minimize contaminant transfer from the posts 902 to the die 202, by reducing contact with the die 202 edges.

Any of the surfaces, such as 402, 401, 504, 902, etc., may be rounded or tapered to limit the area or region of contact with dies 202.

In some implementations, the various lateral restraining portions for example 504 and 906, and the longitudinal restraining portions 410 and 906 (FIGS. 7B, 7C, 8A, 8B, 9A, and 9B) may be configured with spring materials, or may be comprised of spring devices, as discussed above. In embodiments where one or more of the restraining portions (410, 504, and 906) are comprised of spring devices (or have gaps, such as with a spring-like construction) one or more of the under die cavity 506 or the channels 408 may not be needed or may not be present on the die tray 402. In such an embodiment, the die 202 is restrained peripherally by arrangement of spring devices and the cleaning fluid or fluids flows with minimal restraints around and under the die 202 through the various gaps in the coils of the spring devices and the gaps between the spring devices.

Figure 10A:
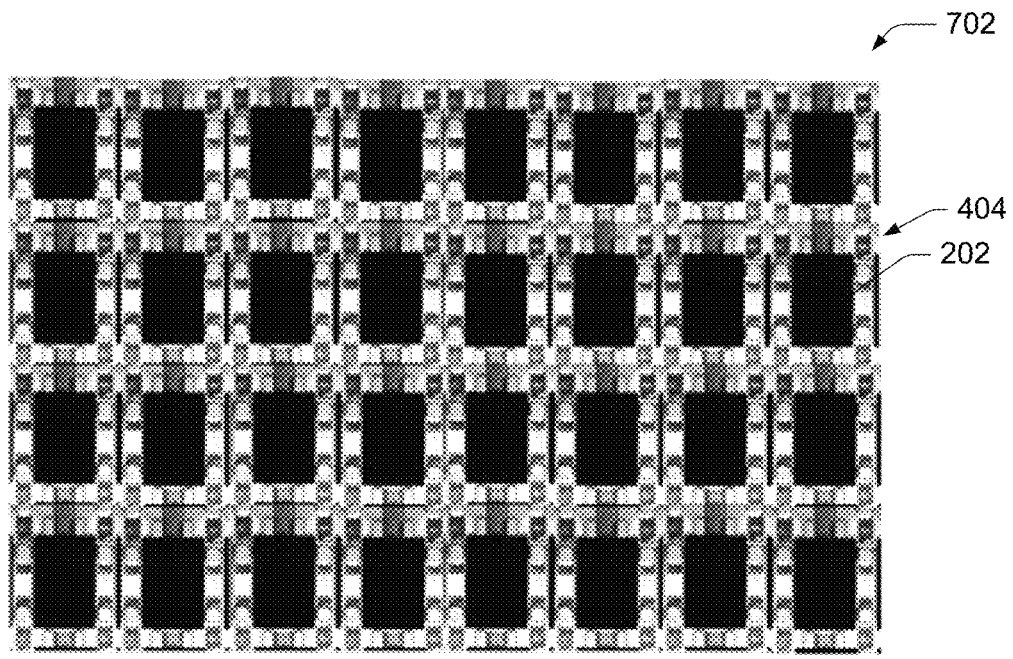
FIG. 10A is an illustration of an example die tray holding an array of dies.
Figure 10B:
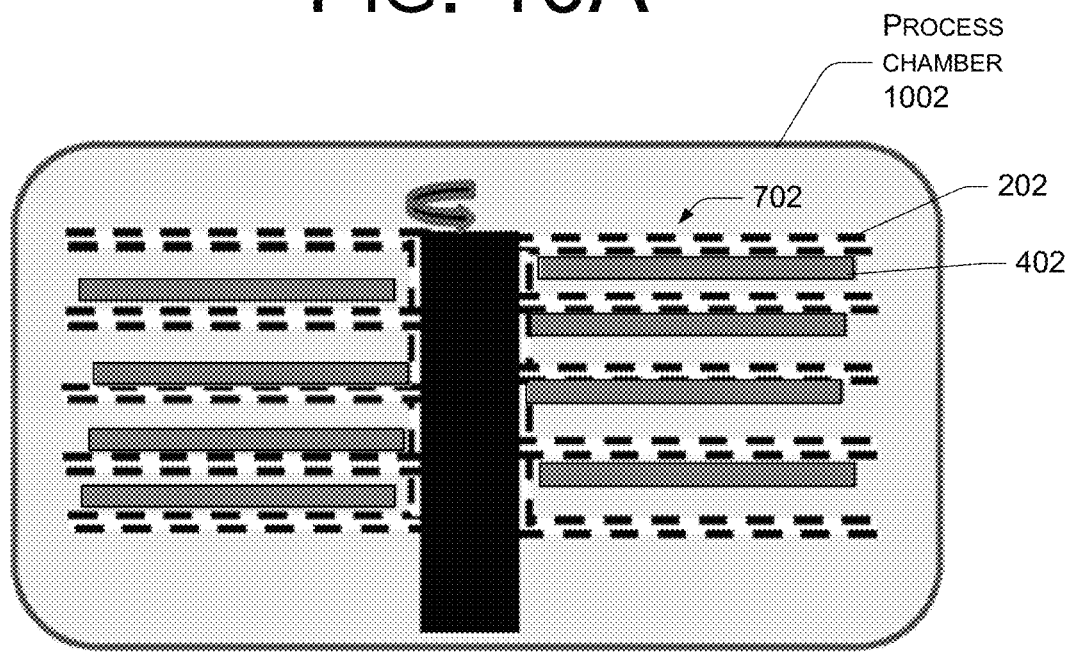
FIG. 10B is an illustration of multiple die trays within a process chamber, according to an embodiment.

Any of the die tray 402 and die pocket 404 designs discussed above, as well as other designs, may be incorporated into a tray array 702, as shown in FIG. 10A. In various embodiments, multiple trays 402 with arrays 702 of dies 202 can be loaded into a cleaning process chamber 1002, such as the one shown in FIG. 10B, or the like. As shown, multiple trays 402 of dies 202 can be cleaned and processed simultaneously, increasing manufacturing throughput.

Figure 11:
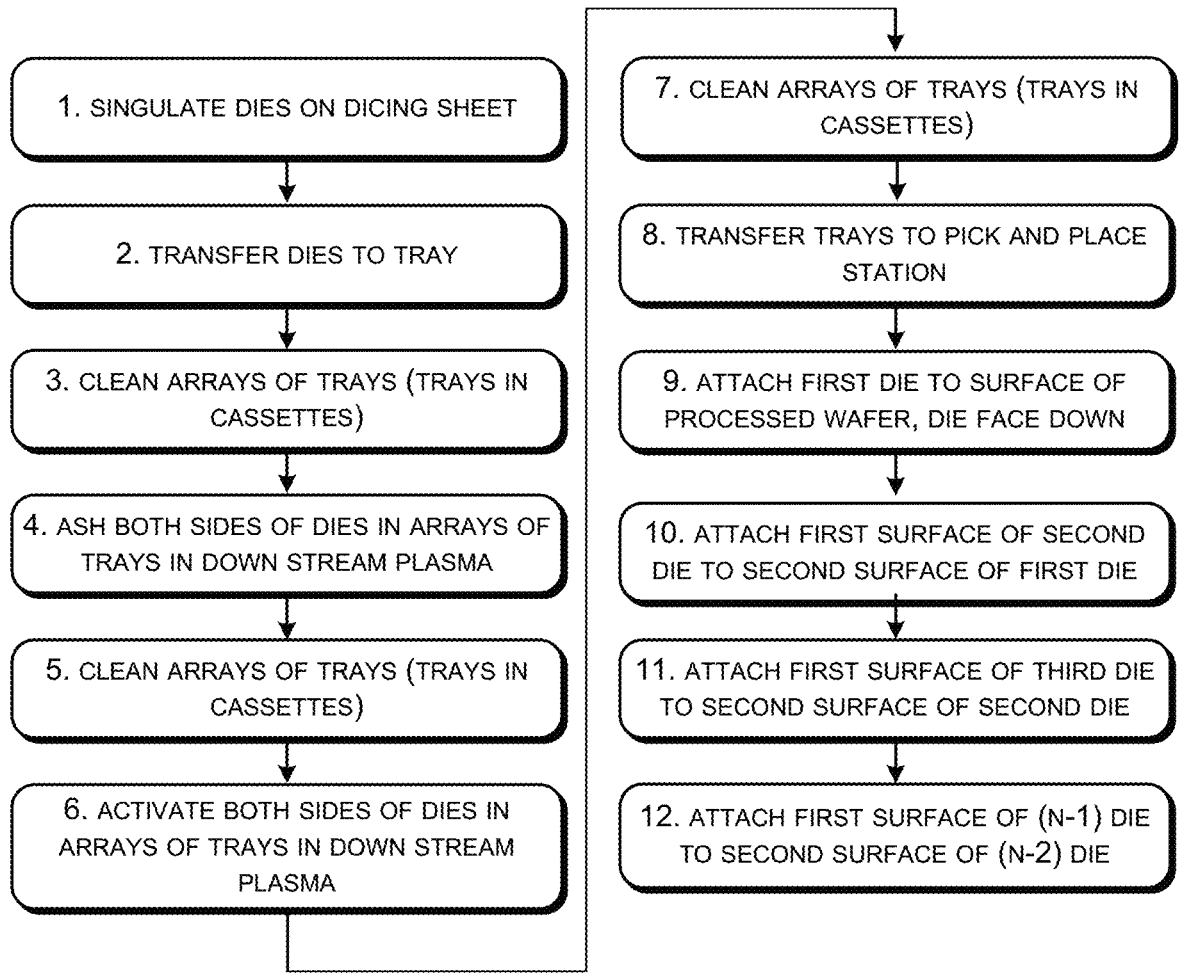
FIGS. 11-13 are flow diagrams illustrating example processes for preparing and stacking dies, according to example implementations.
Figure 12:
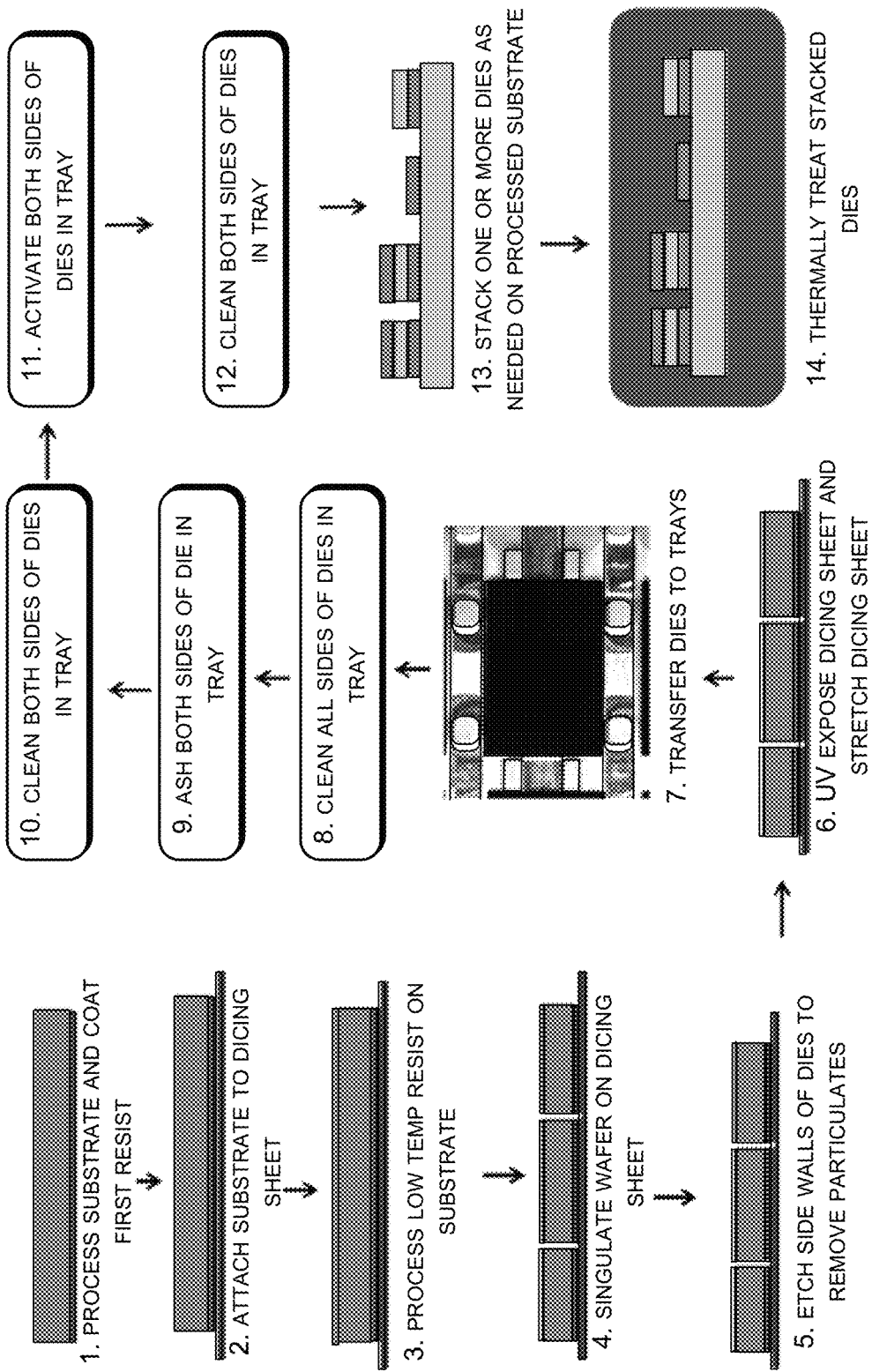
Figure 13:
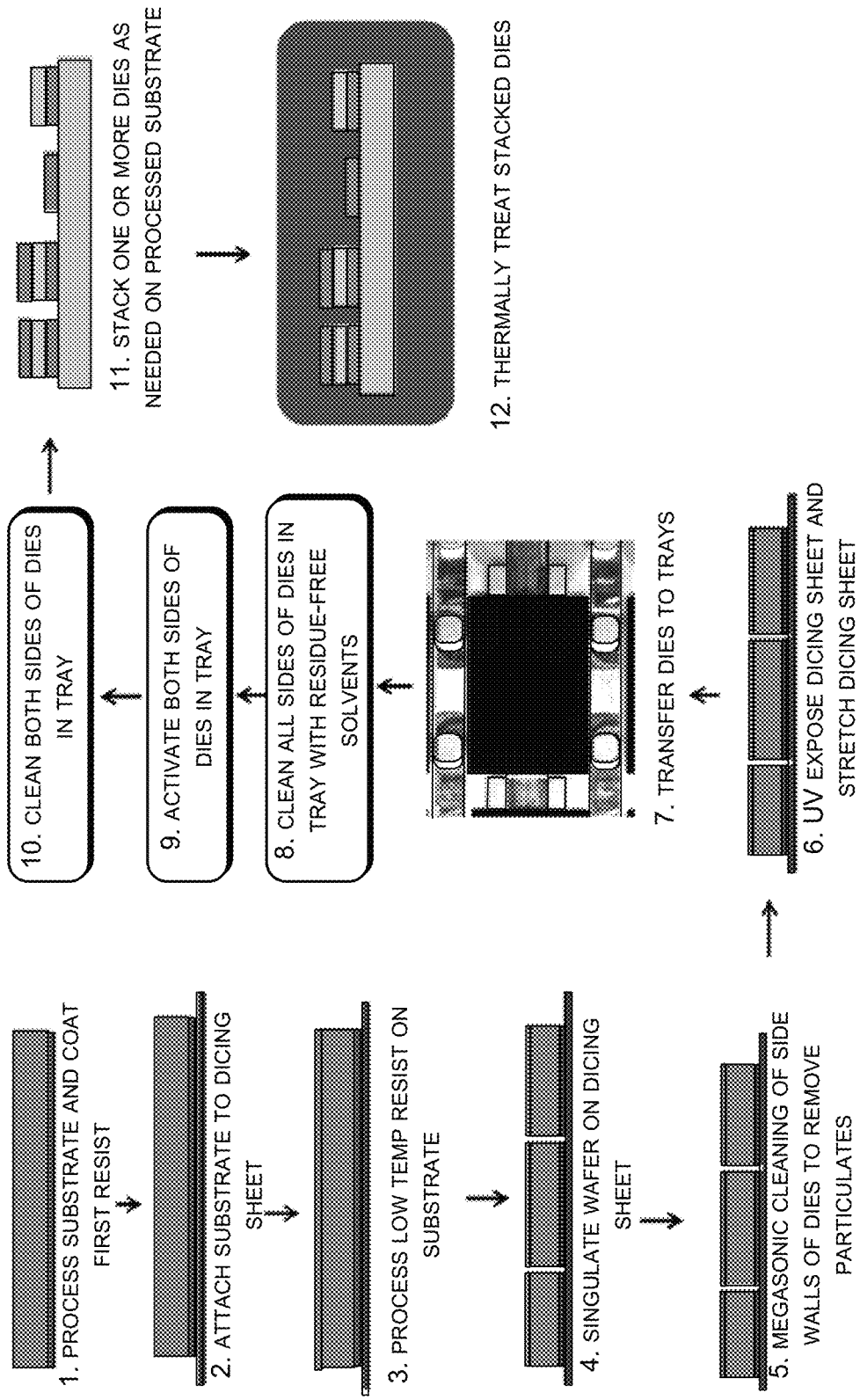

FIGS. 11-13 are flow diagrams illustrating example processes for preparing and stacking dies 202, according to example implementations. The processes described in FIGS. 11-13 use die trays 402 as described above, to reduce process steps and complexity. The order in which the processes are described is not intended to be construed as a limitation, and any number of the described process blocks can be combined in any order to implement the processes, or alternate processes. Additionally, individual blocks may be deleted from the processes without departing from the spirit and scope of the subject matter described herein. Furthermore, the processes can be implemented in any suitable hardware, software, firmware, or a combination thereof, without departing from the scope of the subject matter described herein.

For example, at FIG. 11, blocks 1 and 2, an example process includes singulating a wafer into dies 202 and transferring the dies 202 to a die tray 402 (such as the die trays 402 described above). At blocks 3-7, both surfaces of the multiple dies 202 are cleaned simultaneously in trays 402 (potentially within a cleaning process chamber 1002, for example), both surfaces of the dies 202 are ashed in downstream plasma, both surfaces of the dies 202 are cleaned again, both surfaces of the dies 202 are activated in downstream plasma, and both surfaces of the dies 202 are cleaned yet again, all while remaining in the die trays 402.

At block 8, the trays 402 with the dies 202 are transferred to a pick and place station. At block 9, some of the dies 202 are attached to processed wafers as the first die 202 of a predetermined number of stacked die arrangements 302. At blocks 10-12, others of the dies 202 (which were processed in the die tray 402 also) are stacked to the first dies 202, with the stacking continuing until a desired quantity of dies 202 are stacked in each stacked arrangement 302.

In various examples, the manufacturing process as described with respect to FIG. 11 can use approximately 8+(n); n>0 steps to complete (where n=the desired quantity of dies 202 in the stack 302). This represents a significant reduction in manufacturing steps when compared to the process described with respect to FIG. 1: (13+7(n−1)). Not only is manufacturing cost and complexity reduced by reducing process steps, but opportunities to contaminate the dies are also reduced, resulting in better quality and higher throughput with lower cost.

The flow diagram of FIG. 12 illustrates incorporating the process of FIG. 11 to form stacked die arrangements 302 using direct bonding techniques, hybrid bonding techniques, and the like. For instance, at blocks 1-4, a wafer is processed, including coating with resist, attaching to a dicing sheet, adding a low-temperature resist, and singulating the wafer into dies 202. At block 5, the side walls of the dies 202 are etched to remove particulates. At block 6, the dicing sheet is exposed to UV and stretched, and at block 7, the dies 202 are transferred to die trays 402, as discussed above with reference to FIG. 11.

At blocks 8-12, both surfaces of the dies 202 are cleaned, ashed, cleaned again, activated, and re-cleaned while in the die trays 402. At block 13, the dies 202 are stacked as desired to form stacked die arrangements 302 on processed substrate. At block 14, the stacked dies 202 are thermally treated.

The flow diagram of FIG. 13 illustrates incorporating the process of FIG. 11 to form stacked die arrangements 302 using direct bonding (e.g. ZIBOND® available from Invensas Bonding Technologies, Inc.) or hybrid bonding (e.g. DBI® available from Invensas Bonding Techniques, Inc.) techniques, according to another embodiment, where the ashing step and the subsequent rinsing step is eliminated. For example, blocks 1-7 may be identical to blocks 1-7 of the process described with reference to FIG. 12. With the dies 202 loaded into the die trays 402, both surfaces of the dies 202 are cleaned using residue-free solvents (such as methanol, for example) at block 8, both surfaces of the dies 202 are activated at block 9, and both sides are cleaned at block 10.

At block 11, the dies 202 are stacked as desired to form stacked die arrangements 302 on processed substrate. At block 12, the stacked dies 202 are thermally treated. Thus, the process can be completed with two less steps.

In alternate implementations, other techniques may be included in the process in various combinations, and remain within the scope of the disclosure.

Additional Embodiment

Figure 14A:
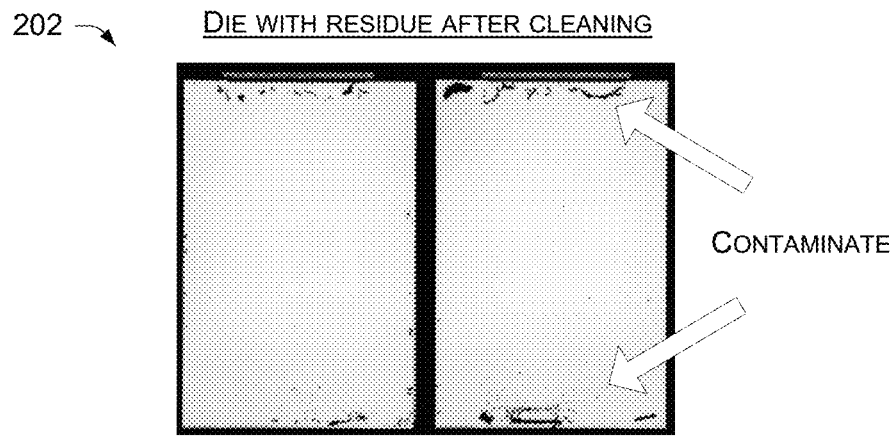
FIG. 14A is an illustration of a front surface and a back surface of a die before a brush cleaning process.

In an embodiment, as shown in FIG. 14A, some particles, organic adhesive residues or contaminant may remain on one or more surfaces of a die 202 after the die 202 has been otherwise cleaned and bonded on a substrate. In the embodiment, a brush 1402 as shown in FIG. 14B may be used to remove the organic adhesive residues, particles, or contaminant from the die 202 surface and substrate.

Figure 14B:
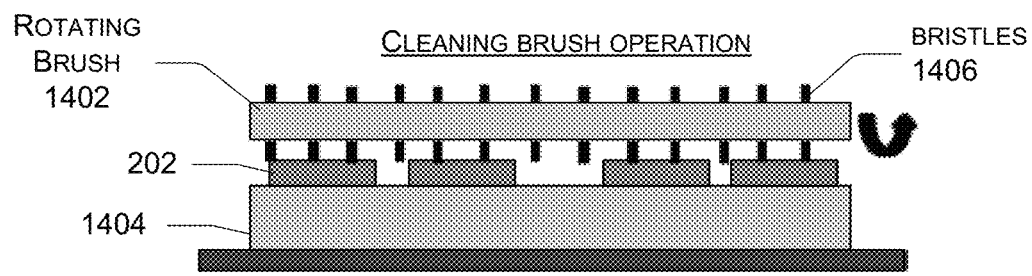
FIG. 14 B is an illustration of an example die cleaning brush.
FIG. 14C is an illustration of the front surface and the back surface of the die of FIG. 14A after the brush cleaning process.

In an implementation, as shown in FIG. 14B, the brush 1402 rotates, vibrates, or otherwise scrubs in one or a plurality of directions, as it contacts the exposed surface of the dies 202 and penetrates into the spaces between the dies 202, to clean the surfaces and the edges of the dies 202 and the surface of the substrate 1404. In various embodiments, the brush 1402 is used with a surfactant to assist the cleaning operation. In an example, the bristles 1406 of the brush 1402 are comprised of a soft, non-shedding durable polymer material, such as polypropylene, polyethylene, nylon, polyurethane, polyether, their various copolymer, or the like. In some applications the brush 1402 may comprise an ultrasonic or megasonic brush for simultaneously scrubbing and cleaning the back surface of the bonded dies 202, the exposed surface of the substrate 1402 (regions without bonded dies 202), and the edges of the bonded or stacked dies.

Figure 14C:
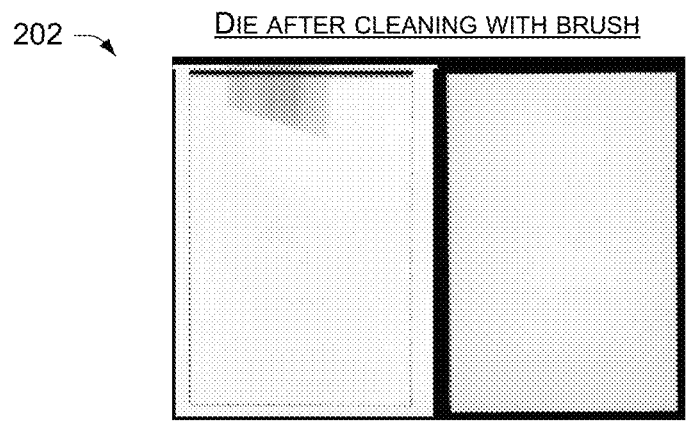

FIG. 14C shows the die 202 surfaces of FIG. 14A after cleaning using the brush 1402 described with reference to FIG. 14B. As shown, cleaning the surfaces with the brush 1402 results in a significant improvement in the cleanliness of the die 202 surfaces.

The techniques, components, and devices described herein are not limited to the illustrations of FIGS. 1-13, and may be applied to other designs, types, arrangements, and constructions including with other electrical components without departing from the scope of the disclosure. In some cases, additional or alternative components, techniques, sequences, or processes may be used to implement the techniques described herein.

For example, in some embodiments, after the various dies cleaning steps and die surface preparations described in the foregoing, the dies 202 may be transferred from the spin plate or cleaning tray 402 to a flip plate, to position the dies 202 face down (the bottom surfaces of the dies 202 are up). Referring again to FIG. 1, at block 11, the dies 202 are transferred to a pick and place station, where (at block 12) the dies 202 are attached to a wafer surface, with the dies 202 face down. At block 13, the dies 202 on the wafer are thermally treated.

The components and/or techniques may be arranged and/or combined in various combinations, while resulting in similar or approximately identical results.

Unless otherwise specified, additional or alternative components to those specifically mentioned may be used to implement the techniques described herein. In various implementations, a die 202 may be a stand-alone unit, or it may be a portion of a system, component, structure, or the like.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

Each claim of this document constitutes a separate embodiment, and embodiments that combine different claims and/or different embodiments are within the scope of the disclosure and will be apparent to those of ordinary skill in the art upon reviewing this disclosure.

What is claimed is:

1. An apparatus, comprising:
a substantially planar tray;
an array of support posts disposed at a surface of the tray, each post configured to elevate an element off the surface of the tray, the element having a substantially planar shape with a plurality of vertices;
a quantity of retaining posts equal to the number of element vertices disposed on a surface of the tray, each retaining post positioned at a first side of each vertex of the element and arranged to laterally restrain the element loaded onto the support posts;
a quantity of mount posts equal to the number of element vertices disposed on a surface of the tray, each mount post positioned at a second side of each vertex of the element, paired with each retaining post and arranged to longitudinally restrain the element loaded onto the support posts, the retaining posts and the mount posts trapping each vertex of the element; and
one or more channels under the said element arranged to direct fluids away from the element.

2. The apparatus of claim 1, wherein one or more of the support posts of the array of support posts includes at least a portion with a contoured or elliptical surface.

3. An apparatus, comprising:
a tray;
an array of support posts disposed on a surface of the tray, the support posts configured to support and elevate an element off the surface of the tray, the array of support posts comprising a first set of supporting posts and a second set of supporting posts, the first set of supporting posts arranged to support the element at a different height with respect to the tray surface than the second set of supporting posts;
a plurality of lateral restraining posts coupled to the support posts and arranged to laterally restrain the element loaded onto the support posts; and
a plurality of longitudinal restraining posts coupled to support posts and arranged to longitudinally restrain the element loaded onto the support posts.

4. The apparatus of claim 3, further comprising one or more channels under the element arranged to direct fluids away from the element.

5. The apparatus of claim 3, wherein at least a portion of one or more of the support posts includes an elliptical surface.

6. The apparatus of claim 3, wherein a portion of one or more of the support posts includes an opening arranged to move fluids away from a surface of the element.

7. The apparatus of claim 3, wherein one or more of the support posts comprises a first portion comprising a lateral restraining post and/or a longitudinal restraining post, whereby the element is restrained from moving in an x or y direction, respectively, by the first portion and a second portion comprising an element mounting post, whereby the element rests on the second portion, elevated from the surface of the tray in a z direction.

8. The apparatus of claim 7, wherein the first portion is disposed above the second portion in the z direction on the one or more of the support posts.

9. The apparatus of claim 7, wherein for each element supported, the tray includes at least four support posts, with each support post disposed at a different vertex of the element and with each support post including one lateral restraining post and one longitudinal restraining post positioned on either side of the vertex.

10. The apparatus of claim 3, further comprising a clearance gap disposed between the element and at least one of the lateral or longitudinal restraining support posts.

* * * * *